(12) United States Patent
Eun

(10) Patent No.: US 7,989,287 B2
(45) Date of Patent: Aug. 2, 2011

(54) METHOD FOR FABRICATING STORAGE NODE ELECTRODE IN SEMICONDUCTOR DEVICE

(75) Inventor: Byung Soo Eun, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/834,135

(22) Filed: Jul. 12, 2010

(65) Prior Publication Data

US 2011/0065251 A1 Mar. 17, 2011

(30) Foreign Application Priority Data

Sep. 14, 2009 (KR) ........................ 10-2009-0086648

(51) Int. Cl.
*H01L 21/8242* (2006.01)
(52) U.S. Cl. ................................. 438/256; 257/E21.649
(58) Field of Classification Search .................. 438/256, 438/970
See application file for complete search history.

(56) References Cited

U.S. PATENT DOCUMENTS

| 7,067,385 | B2 * | 6/2006 | Manning | 438/387 |
| 7,572,711 | B2 * | 8/2009 | Park et al. | 438/396 |
| 2007/0241380 | A1 | 10/2007 | Hasunuma | |
| 2009/0073736 | A1 | 3/2009 | Cho et al. | |

FOREIGN PATENT DOCUMENTS

| KR | 1020080088276 A | 10/2008 |
| KR | 1020080088921 A | 10/2008 |

* cited by examiner

*Primary Examiner* — Chandra Chaudhari
(74) *Attorney, Agent, or Firm* — Ladas & Parry LLP

(57) ABSTRACT

A method for fabricating a storage node electrode in a semiconductor device includes: performing a primary high density plasma (HDP) process to form a first HDP oxide film over an etch stop film; performing a secondary HDP process to form a second HDP oxide film on the first HDP oxide film; forming a support film over the second HDP oxide film; performing a tertiary HDP process to form a third HDP oxide film over the support film; forming a storage node electrode on an exposed surface of the storage node contact hole; partially removing the third HDP oxide film and the support film so that a support pattern supporting the storage node electrode is formed; and exposing an outer surface of the storage node electrode by removing the second HDP oxide film and the first HDP oxide film.

13 Claims, 14 Drawing Sheets

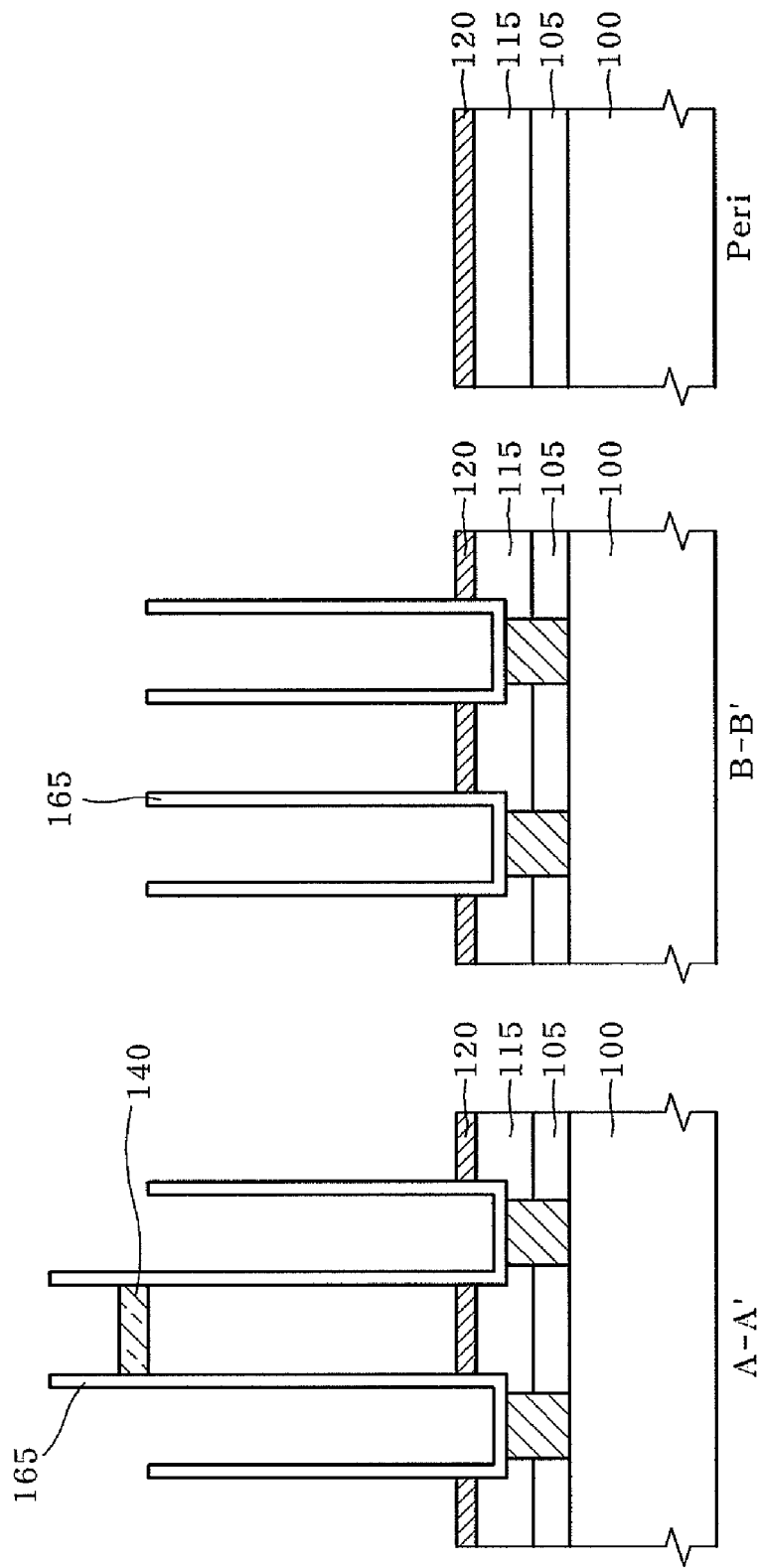

METHOD FOR FABRICATING STORAGE NODE ELECTRODE IN SEMICONDUCTOR DEVICE

CROSS-REFERENCES TO RELATED APPLICATIONS

The present application claims priority under 35 U.S.C 119(a) to Korean application number 10-2009-0086648, filed on Sep. 14, 2009, in the Korean intellectual property Office, which is incorporated herein by reference in its entirety set forth in full.

BACKGROUND

Exemplary embodiments of the present invention relate to a method for fabricating a semiconductor device, and more particularly, to a method for fabricating a storage node in a semiconductor device.

As the integration density of semiconductor devices increases, the size of the semiconductor devices is being reduced. Thus, an important issue is to somehow ensure an adequate capacity for a capacitor. In particular, in the case of a dynamic random access memory (DRAM) consisting of a transistor and a capacitor, it is very important to increase a capacitance while reducing an area of the capacitor. In order to increase the capacity of a capacitor, various capacitor materials and various capacitor fabricating methods have been developed. For example, a method which increases a height of a capacitor can improve a capacitance by increasing an area of a capacitor, but suffers a physical limitation in increasing the height of the capacitor due to a deficient process margin of a photo process and an etching process.

One of methods which increase an area of a capacitor in order to ensure an adequate capacitance for a capacitor is to use a meta stable poly silicon (MPS) process. An MPS process is applied to a concave structure. A method for increasing a capacitance of a capacitor by using an MPS process can increase an area of a capacitor.

However, as the integration density of semiconductor devices has recently increased, the semiconductor devices shrinks in size and the capacitor also shrinks in size. A space margin in which an MPS process can be performed is not sufficiently ensured, causing a bridge at an upper portion of the capacitor. Furthermore, the concave structure has a limit in increasing a capacitance of a capacitor because only one surface of the capacitor is used.

SUMMARY

In one embodiment, a method for fabricating a storage node electrode in a semiconductor device includes: forming an etch stop film over an interlayer dielectric film in which a contact plug is formed; performing a primary high density plasma (HDP) process to form a first HDP oxide film over the etch stop film; performing a secondary HDP process to form a second HDP oxide film on the first HDP oxide film, an etching rate of the second HDP oxide film being slower than an etching rate of the first HDP oxide film; forming a support film over the second HDP oxide film; performing a tertiary HDP process to form a third HDP oxide film over the support film; forming a storage node contact hole exposing the contact plug by patterning the third HDP oxide film to the first HDP oxide film; forming a storage node electrode on an exposed surface of the storage node contact hole; partially removing the third HDP oxide film and the support film so that a support pattern supporting the storage node electrode is formed; and exposing an outer surface of the storage node electrode by removing the second HDP oxide film and the first HDP oxide film.

Before the first HDP process, the method may further include performing a pre-heating to form a plasma oxide film by oxidizing a partial surface of the etch stop film.

The primary pre-heating may include supplying power for plasma generation while supplying a pre-heating gas including oxygen gas to the etch stop film, and forming a plasma oxide film by oxidizing a partial surface of the etch stop film.

The primary HDP process may include forming the first HDP oxide film by generating plasma while supplying an HDP deposition source to the semiconductor substrate.

The HDP deposition source may include oxygen ($O_2$) gas, silane ($SiH_4$) gas, and helium (He) gas.

An etching rate of the second HDP oxide film may be three to five times slower than an etching rate of the first HDP oxide film.

The secondary HDP process may be performed to generate plasma while additionally supplying hydrogen gas and argon gas to the first HDP oxide film together with the HDP deposition source.

The secondary HDP process may be performed while applying a bottom power for generation of the plasma at a higher level than the primary HDP process.

Before the tertiary HDP process, the method may include performing a secondary pre-heating to form a plasma oxide film by oxidizing a partial surface of the support film.

The secondary pre-heating may include supplying power for plasma generation while supplying a pre-heating gas including oxygen gas to the etch stop film, and forming a plasma oxide film by oxidizing a partial surface of the etch stop film.

The support film may include a nitride film and have a tensile stress of approximately 1E10 dyne/cm2 by using a low pressure deposition in a furnace.

The tertiary HDP process may include generating plasma while additionally supplying hydrogen gas and argon gas to the support film together with an HDP deposition source, and forming a third HDP oxide film whose etching rate is substantially identical to an etching rate of the second HDP oxide film.

The processes from the first HDP process to the third HDP process are performed in-situ at a process temperature of less than 320° C.

BRIEF DESCRIPTION OF THE DRAWINGS

The above and other aspects, features and other advantages will be more clearly understood from the following detailed description taken in conjunction with the accompanying drawings, in which:

FIGS. 1A to 1L illustrate a method for fabricating a storage node electrode in a semiconductor device according to an embodiment of the present invention;

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
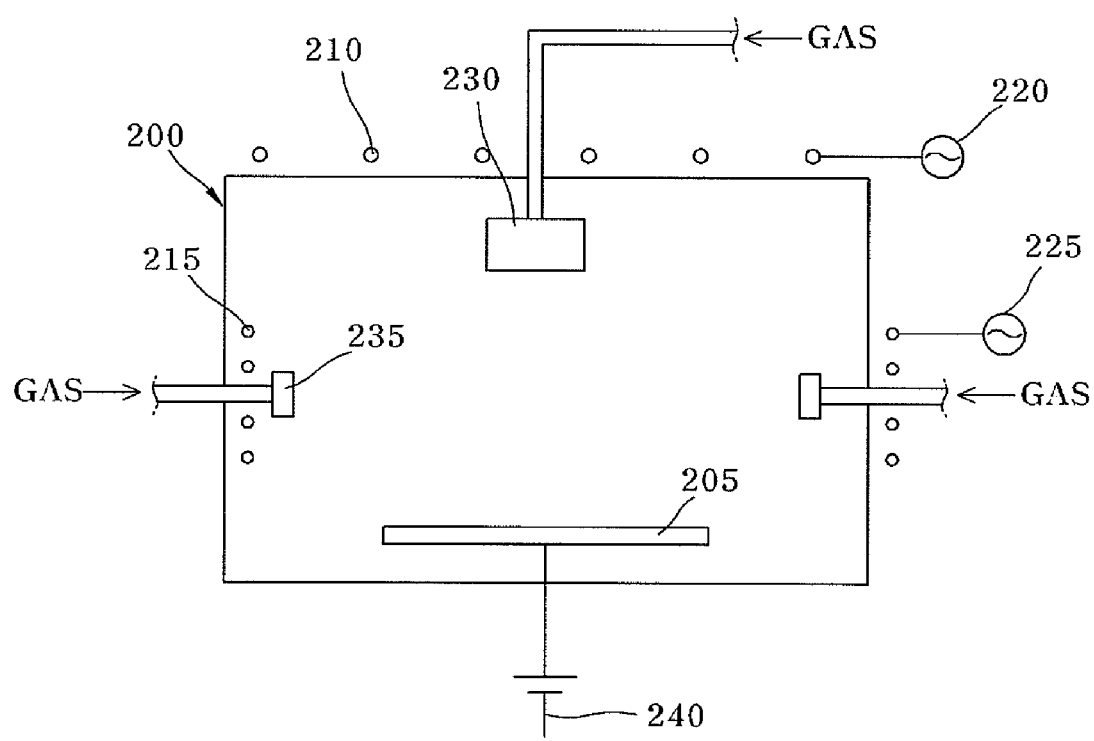
FIG. 2 schematically illustrates an HDP deposition apparatus using a deposition process according to an embodiment of the present invention.
Figure 3:
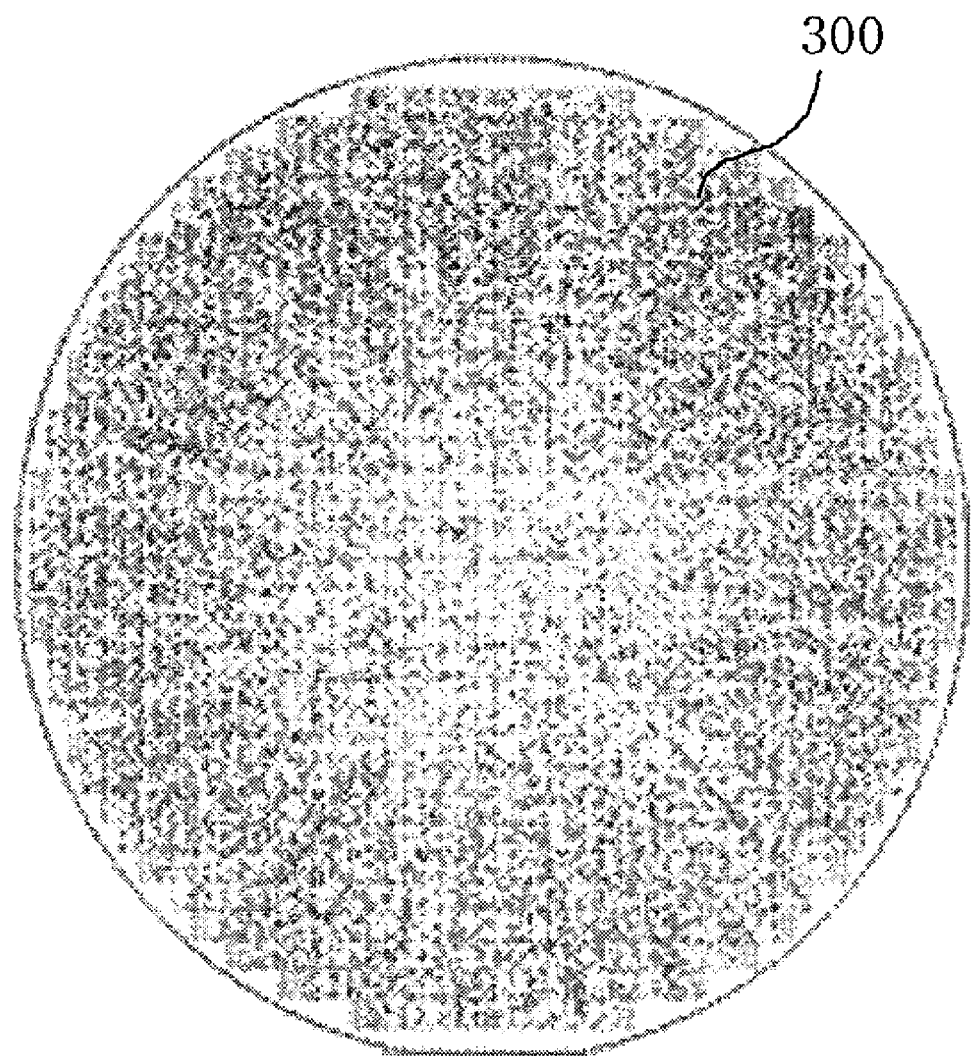
FIG. 3 is a map showing a defect distribution caused by a carbon residue remaining on a wafer.

FIGS. 1A to 1L illustrate a method for fabricating a storage node electrode in a semiconductor device according to an embodiment of the present invention. FIG. 2 schematically illustrates an HDP deposition apparatus using a deposition process according to an embodiment of the present invention. FIG. 3 is a map showing a defect distribution caused by a carbon residue remaining on a wafer.

Figure 1A:
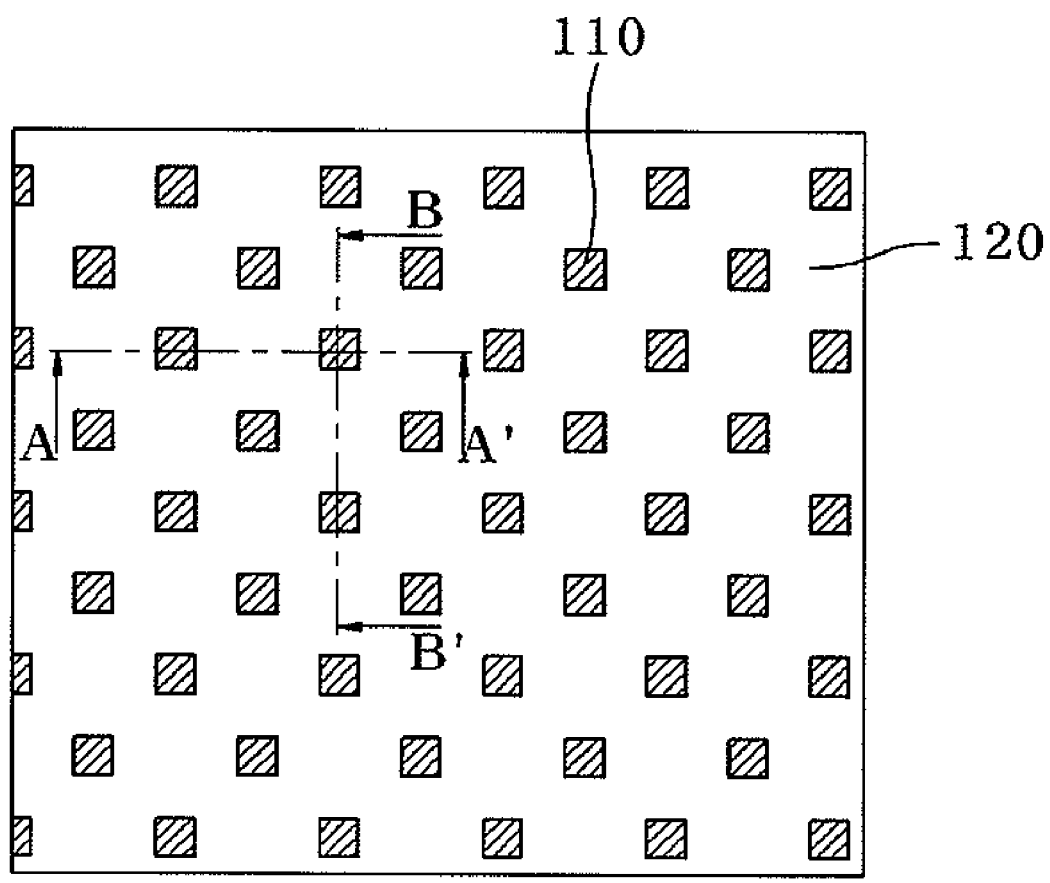
Figure 1B:
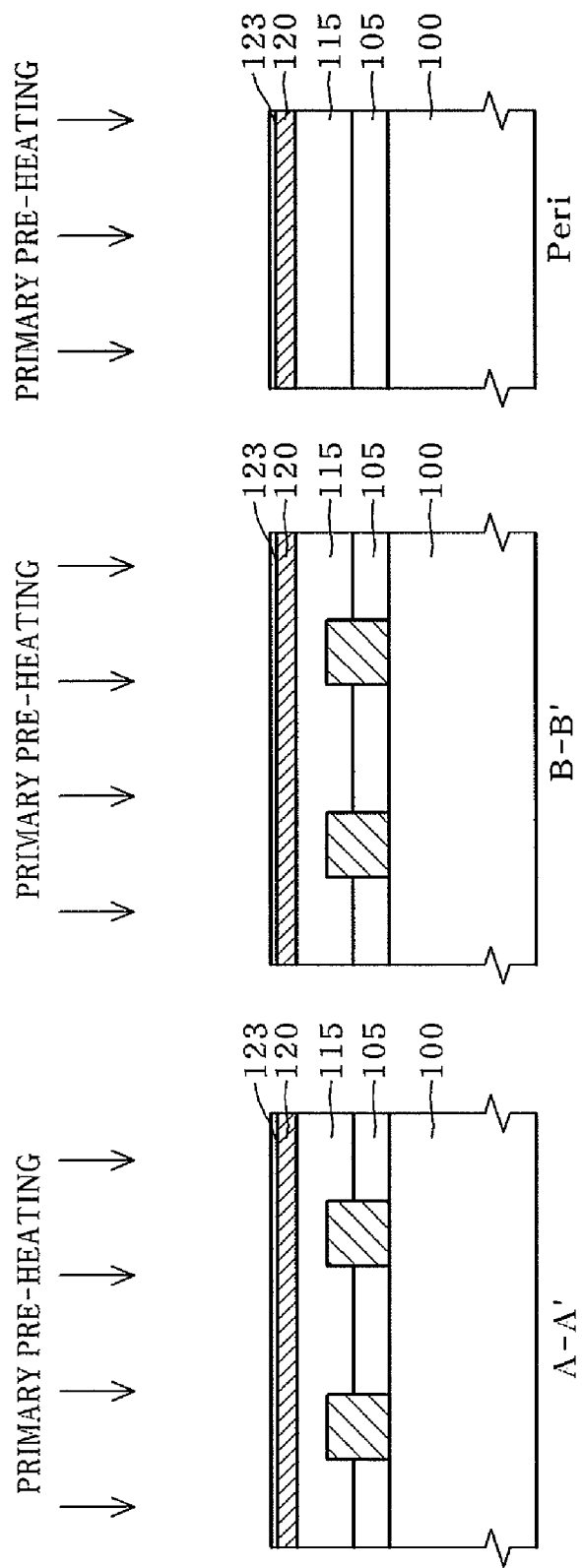

Referring to FIGS. 1A and 1B, an interlayer dielectric film 105 including contact plugs 110 is formed on a semiconductor substrate 100. FIG. 1B illustrates a cross-section taken along line A-A' of FIG. 1A, a cross-section taken along line B-B' of FIG. 1A, and a cross-section of a peripheral region. Detailed description of these cross-sections will be omitted. Although not shown, a lower structure including word lines and bit lines is formed on the semiconductor substrate 100. The contact plugs 110 may be formed by forming contact holes selectively exposing the lower structure within the interlayer dielectric film 105 and then filling the contact holes with a conductive material. The contact plugs 110 serve to couple the lower structure to a capacitor which will be subsequently formed. A buffer oxide film 115 and an etch stop film 120 are formed on the contact plugs 110. The etch stop film 120 prevents an overetching during a subsequent process of forming contact holes for storage nodes. The etch stop film 120 may be formed of a material (for example, silicon nitride ($Si_3N_4$)) having an etch selectivity to an oxide film.

A primary pre-heating is performed on the semiconductor substrate 100 in which the etch stop film 120 is formed. In the primary pre-heating, a partial surface of the etch stop film 120 is oxidized by supplying oxygen ($O_2$) gas plasma to the etch stop film 120, thereby forming a plasma oxide film 123. As a result, the pre-heating serves to prevent a lifting phenomenon that a first HDP oxide film to be formed later is lifted off from the etch stop film 120. In this embodiment, the pre-heating is performed within an HDP deposition chamber.

Referring to FIG. 2, an HDP deposition apparatus includes a process chamber 200 and a chuck 205 on which a semiconductor substrate is mounted within the process chamber 200. A top plasma coil 210 may be disposed above the process chamber 200, and a side plasma coil 215 may be disposed at a side of the process chamber 200. The top plasma coil 210 is coupled to a first power 220 which supplies a radio frequency (RF) power for plasma generation as a top power, and the side plasma coil 215 is coupled to a second power 225 which supplies an RF power for plasma generation as a side power. In addition, the chuck 205 is coupled to a third power 240 which supplies a DC power as a bottom power in order to guide straightness of plasma by applying a bias to a backside of the semiconductor substrate. A top gas supply unit 230 configured to supply a reaction gas is disposed at an upper portion of the process chamber 200, and a side gas supply unit 235 configured to supply a reaction gas is disposed at a side of the process chamber 200.

Referring again to FIGS. 1B and 2, the semiconductor substrate 100 is mounted within the HDP deposition apparatus. Oxygen gas is supplied into the process chamber 200 at a flow rate of approximately 80 sccm to approximately 120 sccm, and argon (Ar) gas and helium (He) gas are also supplied. The argon gas is supplied at a flow rate of approximately 40 sccm to approximately 50 sccm, and the helium gas is supplied from the side gas supply unit 235 and the top gas supply unit 230 at a flow rate of approximately 200 sccm to approximately 300 sccm. At this time, in order to generate plasma within the process chamber 200, the top power is supplied in the range of approximately 4,500 W to approximately 5,500 W, and the side power is supplied in the range of approximately 3,500 W to approximately 4,500 W. In this case, the bottom power is not supplied. The primary pre-heating is performed within 60 seconds. During the primary pre-heating, a cooling is performed within the HDP deposition apparatus by using the helium gas, in order that the primary pre-heating can be performed at a process temperature lower than approximately 320° C. If the entire temperature of the semiconductor substrate 100 is maintained at less than approximately 320° C., it is possible to minimize the damage of the gate dielectric film of the lower structure, which is caused by high-temperature plasma. During the primary pre-heating, the surface of the etch stop film 120 is partially oxidized by supply oxygen gas plasma into the etch stop film 120, thereby forming a plasma oxide film 123. For example, the etch stop film 120 is oxidized by a thickness of approximately 50 Å from the surface thereof.

Figure 1C:
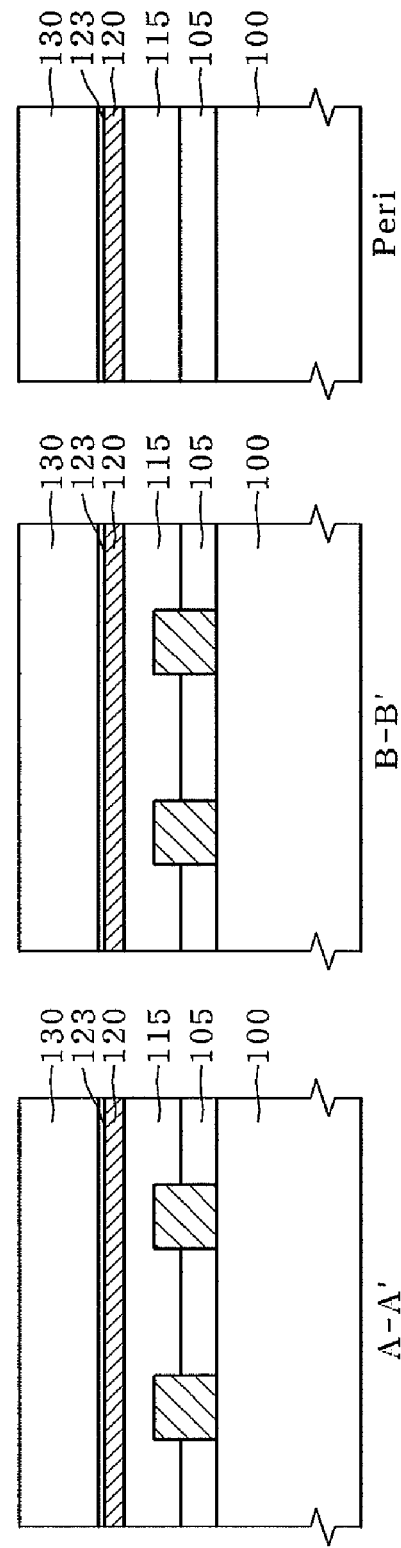

Referring to FIG. 1C, a first HDP oxide film 130 is formed by performing a primary high density plasma process on the etch stop film 120 in which the plasma oxide film 123 is formed by the primary pre-heating. Specifically, an HDP deposition source including oxygen ($O_2$) gas, silane ($SiH_4$) gas, and helium (He) gas is supplied into the process chamber 200 of the HDP deposition apparatus. The oxygen gas is supplied at a flow rate of approximately 100 sccm to approximately 120 sccm. The silane gas is supplied from the side gas supply unit 235 at a flow rate of approximately 40 sccm to approximately 50 sccm and supplied from the top gas supply unit 230 at a flow rate of approximately 25 sccm to approximately 35 sccm. The helium gas is supplied from the side gas supply unit 235 at a flow rate of approximately 180 sccm to approximately 220 sccm and supplied from the top gas supply unit 230 at a flow rate of approximately 80 sccm to approximately 120 sccm. At this time, in order to generate plasma within the process chamber 200, the top power is supplied in the range of approximately 7,500 W to approximately 8,500 W, and the side power is supplied in the range of approximately 4,500 W to approximately 5,500 W. The bottom power is supplied in the range of approximately 450 W to approximately 550 W. The first HDP oxide film 130 is formed to a thickness of approximately 4,000 Å to approximately 6,000 Å at a process temperature lower than 320° C.

The deposition process is controlled so that the first HDP oxide film 130 formed on the plasma oxide film 123 has a fast etching rate substantially identical to that of a phosphorus silicate glass (PSG) oxide film. To this end, the bottom power which guides straightness of plasma by applying a bias to the backside of the semiconductor substrate 100 is applied at a low level ranging from approximately 450 W to approximately 550 W. Consequently, the first HDP oxide film 130 is formed as a soft oxide film having a fast etching rate.

Figure 1D:
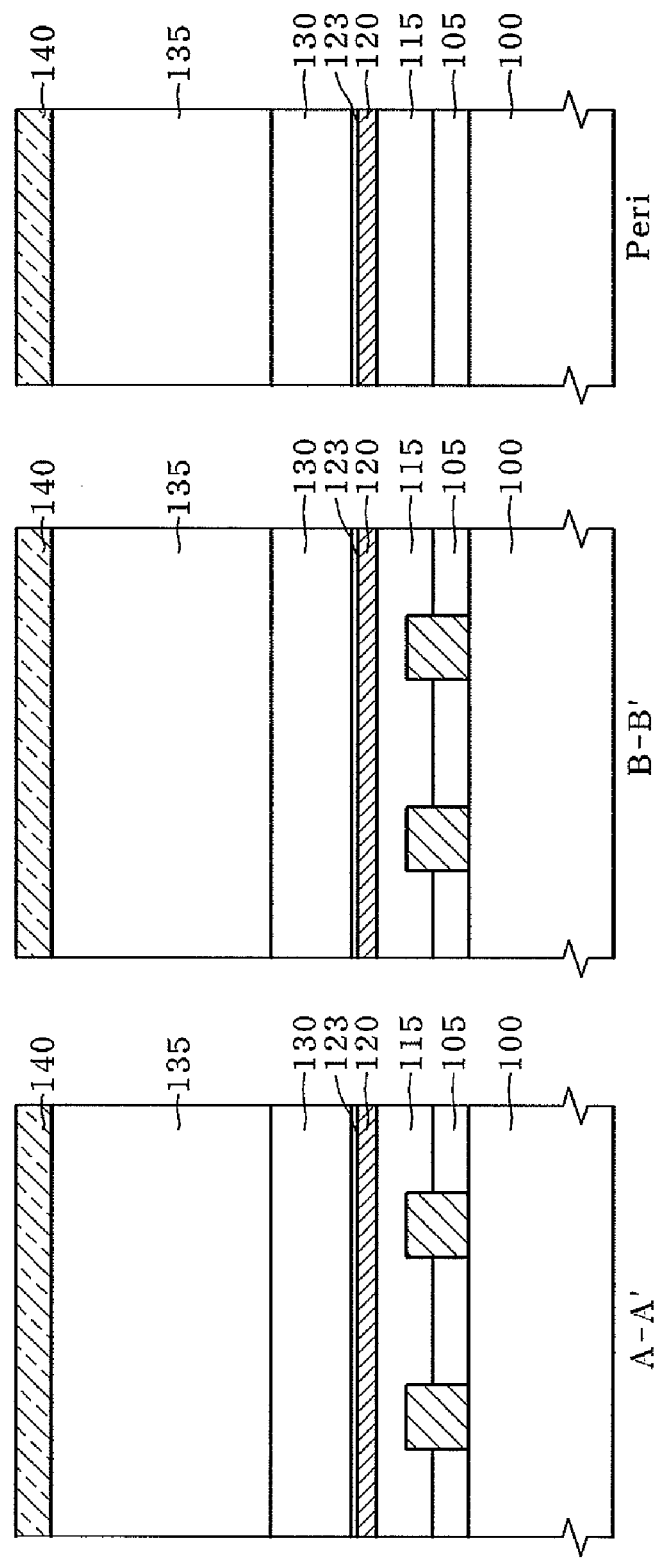

Referring to FIG. 1D, a second HDP oxide film 135 is formed by performing a secondary high density plasma process on the first HDP oxide film 130. Specifically, an HDP deposition source including oxygen ($O_2$) gas, silane ($SiH_4$) gas, and helium (He) gas is supplied into the process chamber 200 of the HDP deposition apparatus. In this case, hydrogen ($H_2$) gas and argon (Ar) gas are additionally supplied together with the HDP deposition source. The oxygen gas is supplied at a flow rate of approximately 100 sccm to approximately 120 sccm. The silane gas is supplied from the side gas supply unit 235 at a flow rate of approximately 40 sccm to approximately 50 sccm and supplied from the top gas supply unit 230 at a flow rate of approximately 25 sccm to approximately 35 sccm. The hydrogen gas is supplied in a flow rate of approximately 45 sccm to approximately 55 sccm. The helium gas is supplied from the side gas supply unit 235 at a flow rate of approximately 180 sccm to approximately 220 sccm and supplied from the top gas supply unit 230 at a flow rate of approximately 80 sccm to approximately 120 sccm. The argon gas is supplied at a flow rate of approximately 45 sccm to approximately 55 sccm.

At this time, in order to generate plasma within the process chamber 200, the top power is supplied in the range of approximately 6,500 W to approximately 7,500 W, and the side power is supplied in the range of approximately 6,500 W to approximately 7,500 W. The bottom power is supplied in the range of approximately 3,500 W to approximately 4,500 W, which is higher as compared with the case of the primary HDP deposition process in which the bottom power is supplied in the range of approximately 450 W to approximately 550 W. The second HDP oxide film 135 is formed to a thickness of approximately 9,000 Å to approximately 12,000 Å at a process temperature lower than 320° C.

The argon gas has the highest plasma activity among gases. Therefore, when the argon gas is supplied together with the HDP deposition source and the bottom power is supplied in the range of approximately 3,500 W to approximately 4,500 W which is higher than the case of the primary HDP deposition process, the second HDP oxide film 135 is formed as a hard oxide film whose etching rate is three to five times slower than that of the first HDP oxide film 130. The processes from the primary preheating to the secondary high density plasma process are performed in-situ. Also, since the gate oxide film has already been formed in the lower structure, gate oxide integrity (GOI) defects may be caused by plasma damage if the high density plasma process is performed at a high temperature of greater than 320° C. For this reason, the high density plasma process is performed at a process temperature of less than 320°.

Since the secondary high density plasma process deposits the oxide film while applying a high bias of approximately 3,500 W to approximately 4,500 W, a planarization process may be omitted. In the case of depositing an oxide film such as a PSG film and a PETEOS (Plasma Enhanced Tetraethylorthosilicate) film, a planarization process is required so as to improve a photomask process margin by a transfer of a lower topology. However, in the case of the high density plasma process, a nonuniform surface of the oxide film is sputtered by the bias applied during the high density plasma process, thereby obtaining a uniform surface of the oxide film. Thus, a planarization process may be omitted.

Next, a support film 140 is formed on the second HDP oxide film 135. The support film 140 serves to support a cylindrical storage node electrode, which will be formed later, in order to prevent the cylindrical storage node electrode from collapsing. In particular, the height of the cylindrical storage node electrode gradually increases in order to increase an effective area, but the diameter thereof gradually decreases. Consequently, an aspect ratio of the cylindrical storage node electrode rapidly increases. In order to substantially prevent the collapse of the storage node electrode or the coupling of the adjacent storage node electrodes due to such a high aspect ratio, a nitride floating cylinder (NFC) process is applied to support the storage node electrodes by coupling the upper portions of the adjacent cylinders with a nitride film. The support film 140 is formed using a nitride film and formed to have a tensile stress of approximately 1E10 dyne/cm$^2$ at a height of approximately 750 Å to approximately 850 Å by using a low pressure deposition process within a furnace.

Figure 1E:
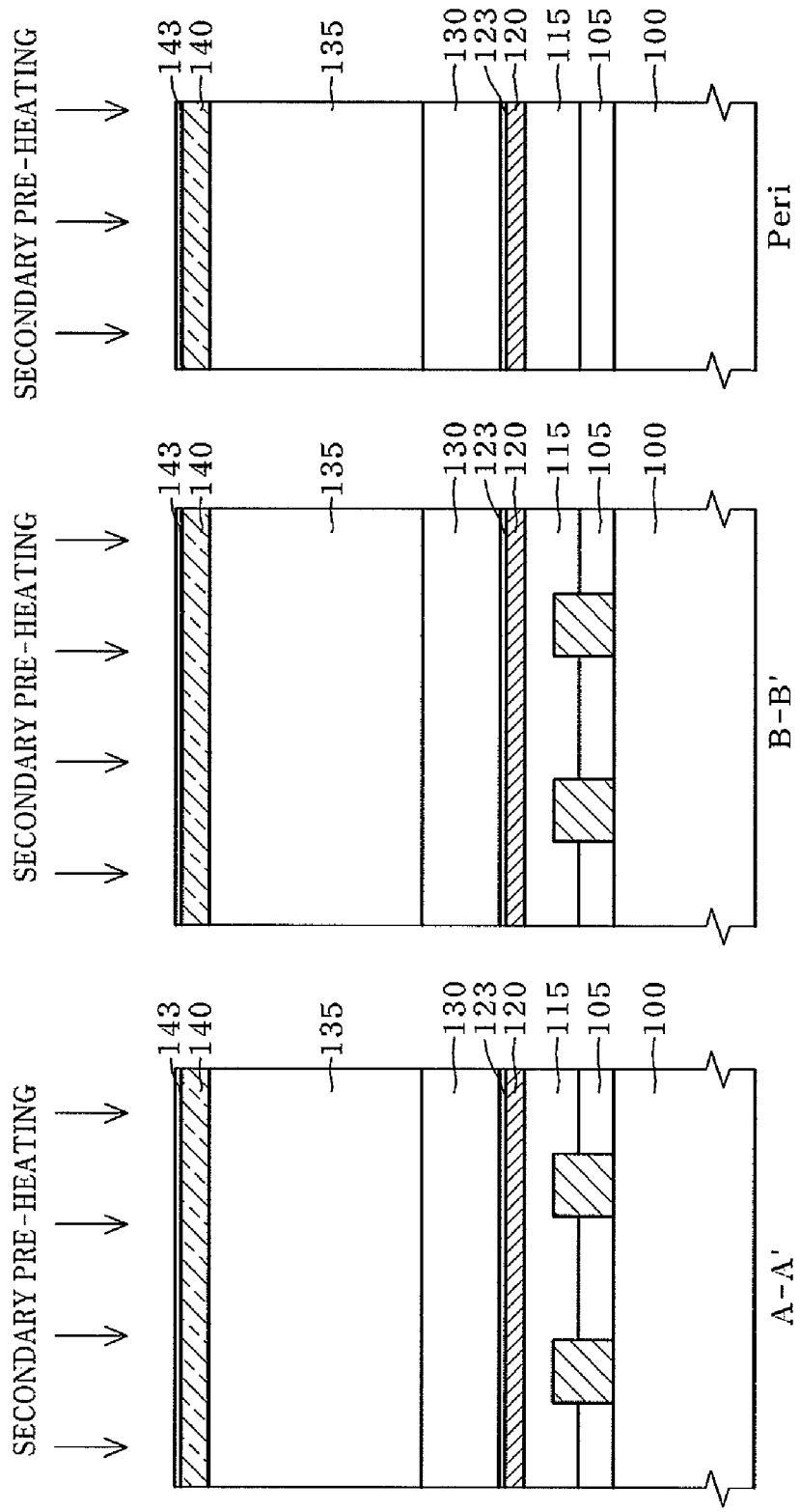

Referring to FIG. 1E, a secondary pre-heating is performed on the semiconductor substrate 100 in which the support film 140 is formed. In the secondary pre-heating, a partial surface of the support film 140 is oxidized by supplying oxygen ($O_2$) gas plasma to the support film 140, thereby forming a plasma oxide film 143. The secondary pre-heating serves to prevent a lifting phenomenon that a third HDP oxide film to be formed later is lifted off. Specifically, oxygen gas is supplied into the process chamber 200 of FIG. 2 at a flow rate of approximately 80 sccm to approximately 120 sccm, and argon (Ar) gas and helium (He) gas are also supplied. The argon gas is supplied at a flow rate of approximately 40 sccm to approximately 50 sccm, and the helium gas is supplied from the side gas supply unit 235 and the top gas supply unit 230 at a flow rate of approximately 200 sccm to approximately 300 sccm. At this time, in order to generate plasma within the process chamber 200, the top power is supplied in the range of approximately 4,500 W to approximately 5,500 W, and the side power is supplied in the range of approximately 3,500 W to approximately 4,500 W. In this case, the bottom power is not supplied. The secondary pre-heating is performed within 60 seconds. During the secondary pre-heating, a cooling is performed within the HDP deposition apparatus by using the helium gas, in order that the secondary pre-heating can be performed at a process temperature of less than approximately 320° C. If the entire temperature of the semiconductor substrate 100 is maintained at less than approximately 320° C., it is possible to minimize the damage of the gate dielectric film of the lower structure, which is caused by high-temperature plasma.

Figure 1F:
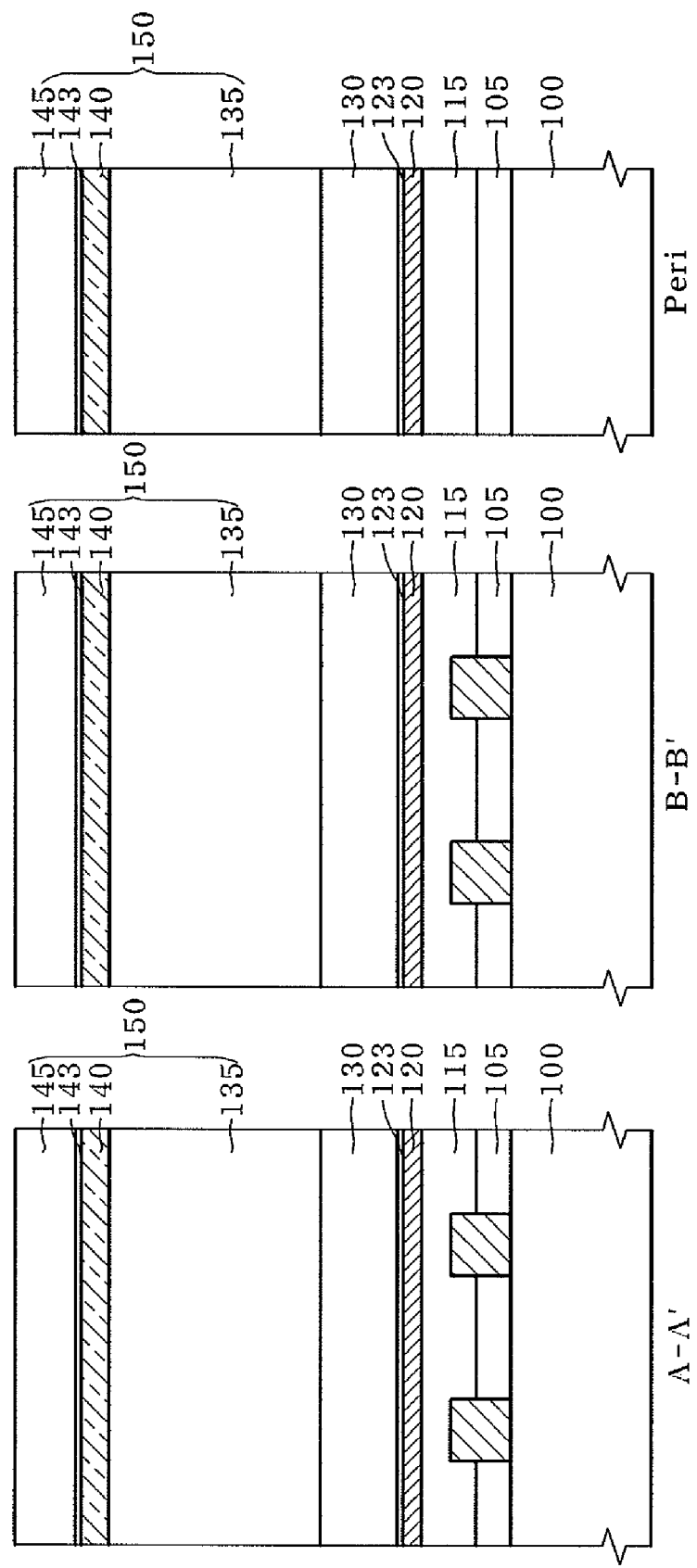

Referring to FIG. 1F, a third HDP oxide film 145 is formed by performing a tertiary high density plasma process on the plasma oxide film 143. Accordingly, a storage node insulation film 150 including the first HDP oxide film 130, the second HDP oxide film 135, the support film 140, the plasma oxide film 143, and the third HDP oxide film 145 is formed. Specifically, an HDP deposition source including oxygen ($O_2$) gas, silane ($SiH_4$) gas, and helium (He) gas is supplied into the process chamber (200 in FIG. 2) of the HDP deposition apparatus. Hydrogen ($H_2$) gas and argon (Ar) gas are supplied together with the HDP deposition source. The oxygen gas is supplied at a flow rate of approximately 100 sccm to approximately 120 sccm. The silane gas is supplied from the side gas supply unit 235 at a flow rate of approximately 40 sccm to approximately 50 sccm and supplied from the top gas supply unit 230 at a flow rate of approximately 25 sccm to approximately 35 sccm. The hydrogen gas is supplied at a flow rate of approximately 45 sccm to approximately 55 sccm. The helium gas is supplied from the side gas supply unit 235 at a flow rate of approximately 180 sccm to approximately 220 sccm and supplied from the top gas supply unit 230 at a flow rate of approximately 80 sccm to approximately 120 sccm. The argon gas is supplied at a flow rate of approximately 45 sccm to approximately 55 sccm. The third HDP oxide film 145 is formed as a hard oxide film having an etching rate substantially identical to that of the second HDP oxide film 135.

At this time, in order to generate plasma within the process chamber 200, the top power is supplied in the range of approximately 6,500 W to approximately 7,500 W, and the side power is supplied in the range of approximately 6,500 W to approximately 7,500 W. The bottom power is supplied in the range of approximately 3,500 W to approximately 4,500 W. The third HDP oxide film 145 is formed at a process temperature of less than 320° C. The secondary pre-heating and the tertiary high density plasma process are performed in-situ at a process temperature of less than 320° C. in order to substantially prevent GOI defects, and the third HDP oxide film 145 is formed to a thickness of approximately 9,000 Å to approximately 12,000 Å.

Figure 1G:
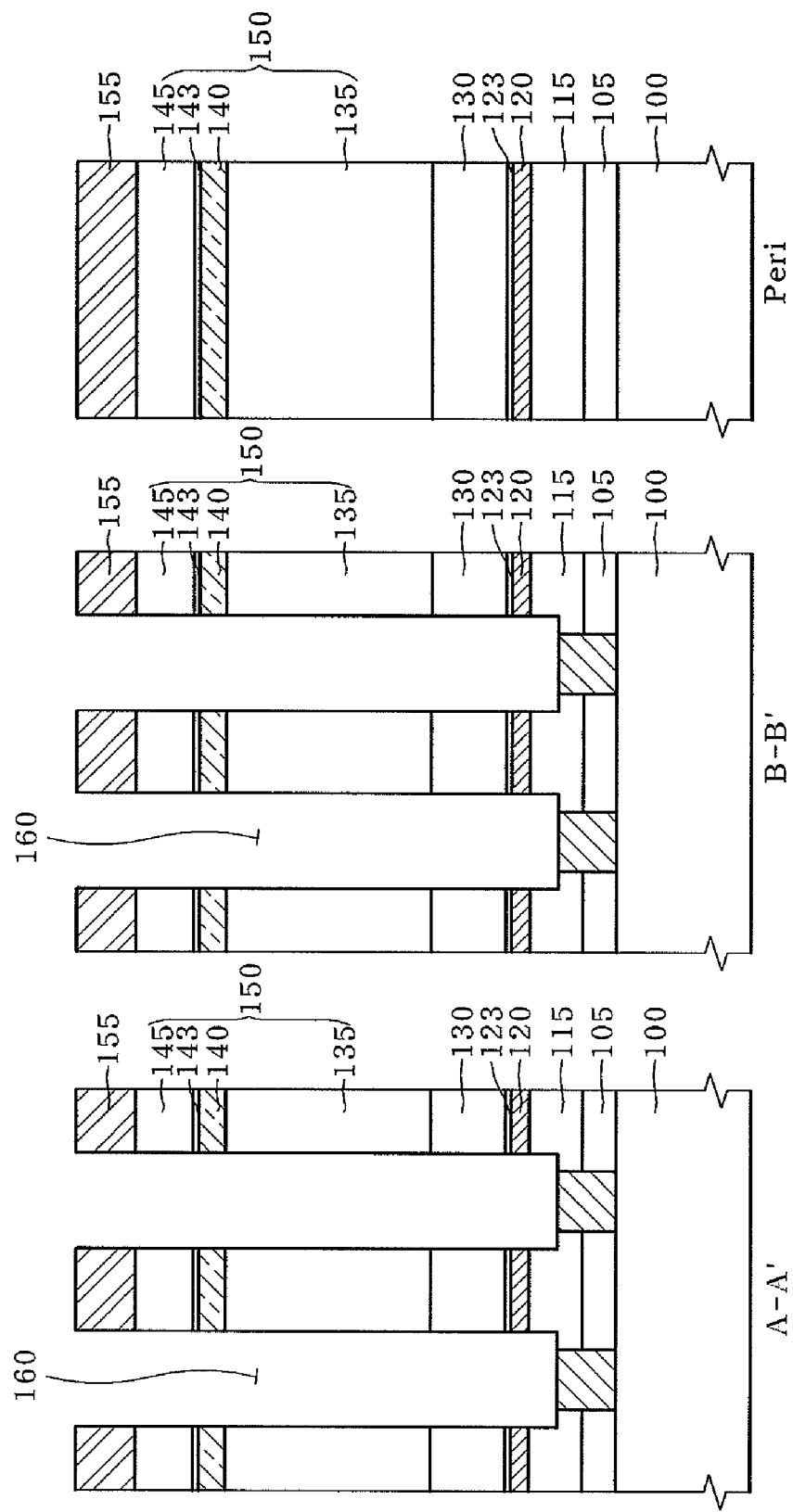

Referring to FIG. 1G, hard mask patterns 155 for storage node contact holes are formed on the third HDP oxide film 145. The hard mask patterns 55 are formed of amorphous carbon films. When the storage node insulation film 150 is formed using an HDP oxide film, it is possible to substantially prevent defects (300 in FIG. 3) from occurring radially in the entire wafer due to the carbon residue during the deposition of the amorphous carbon film when using the storage node insulation film 150 including a PSG oxide film and a PETEOS film formed using a conventional TEOS source. When the oxide film is formed using the TEOS source, a significant amount of carbon is contained within the oxide film and thus a carbon reside remains. However, in this embodiment, since the HDP oxide film is formed without using carbon, the generation of the carbon residue can be prevented.

Storage node contact holes 160 are formed by etching the storage node insulation film 150, which includes the third HDP oxide film 145 to the first HDP oxide film 130, by using the hard mask patterns 155 as an etching mask. The storage node contact holes 160 expose the surfaces of the contact plugs 110. Then, the hard mask patterns 155 are removed.

Figure 1H:
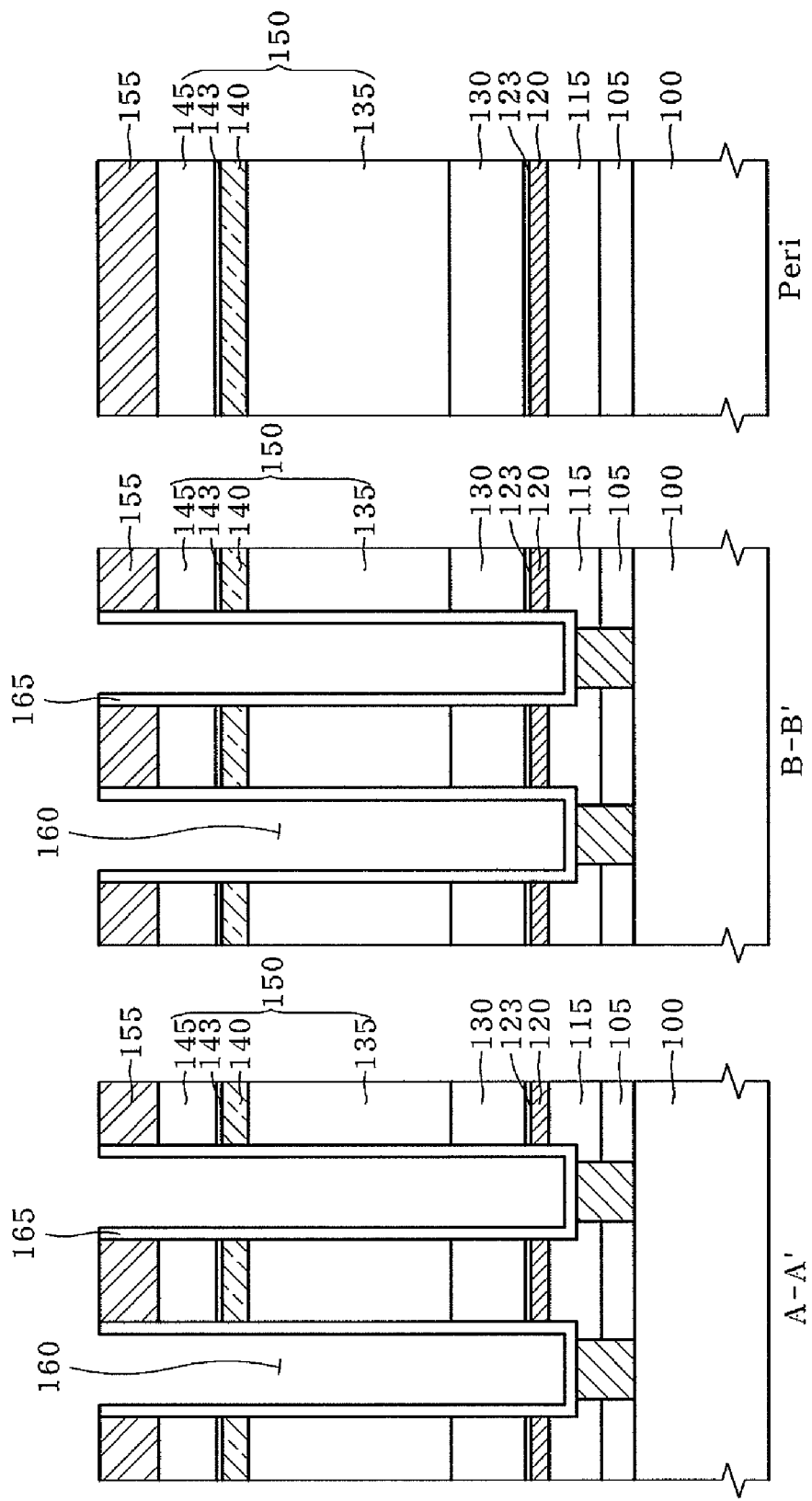

Referring to FIG. 1H, storage node electrodes 165 are formed within the storage node contact holes 160. Specifically, a storage node metal film is formed on the exposed surfaces of the storage node contact holes 160 and the storage node insulation film 150. Storage node electrodes 165 are formed by removing the storage node metal film deposited on the storage node insulation film 150. The storage node electrodes 165 are separated on a cell basis.

Figure 1I:
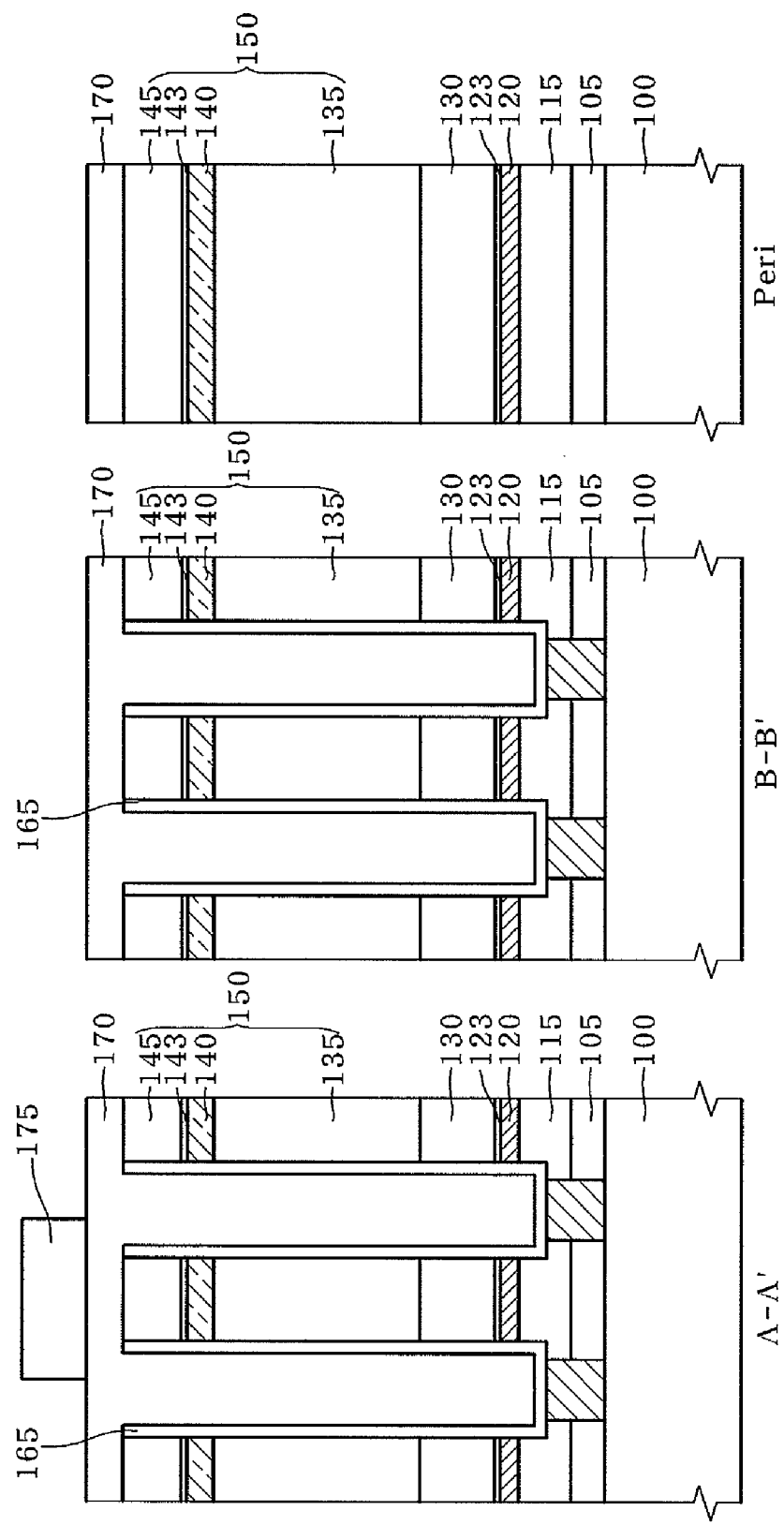

Referring to FIG. 1I, the storage node contact holes 160 are filled by forming an insulation film 170 on the storage node electrodes 165 and the storage node insulation film 150. The insulation film 170 may be formed from an oxide film. A photoresist is coated on the insulation film 170 and patterned to form a photoresist pattern 175. The photoresist pattern 175 defines a region where a support pattern will be formed, in order to prevent the collapse of the storage node electrodes 165 and to prevent removal of the support film 140 formed on the second HDP oxide film 135 in the storage node contact holes 160 that underlie the insulation film 170.

Figure 1J:
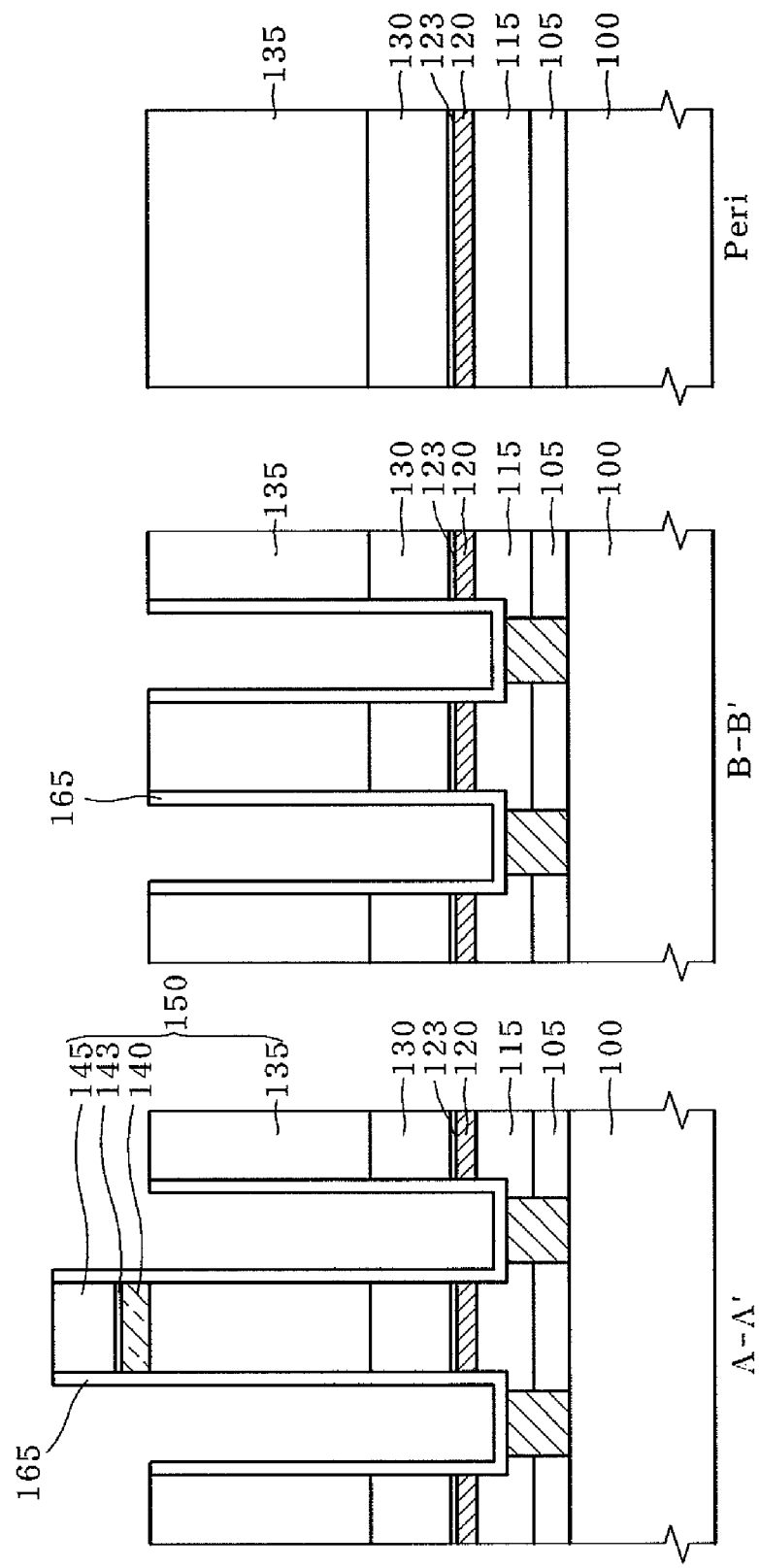

Referring to FIG. 1J, the exposed insulation film 170 and third HDP oxide film 145 are removed by using the photoresist pattern (175 in FIG. 1I) as an etching mask, and the photoresist pattern is then removed.

Figure 1L:
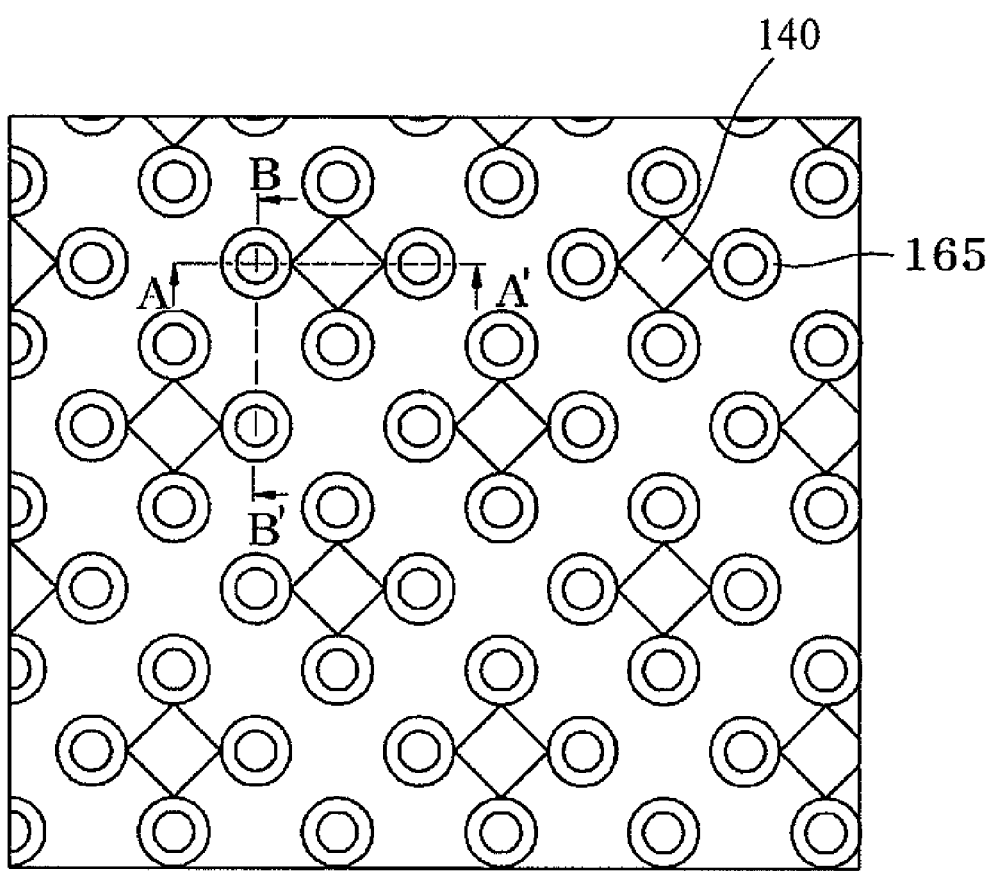

Referring to FIGS. 1K and 1L, a dip-out process is performed. That is, the second HDP oxide film 135 and the first HDP oxide film 130 are completely removed using an oxide film etching solution. FIG. 1L illustrates a top view of FIG. 1K. While the HDP oxide films are completely removed by the dip-out process, the collapse of the storage node electrodes 165 can be substantially prevented by the remaining support film 140 that remained underneath the support patterns 170. As a result the remaining support film 140 substantially supports and prevents the storage node electrodes 165 from collapsing. The second HDP oxide film 135 and the first HDP oxide film 130 are completely removed by the dip-out process, and the outer surfaces of the storage node electrodes 165 are exposed, thereby obtaining the cylindrical storage node electrodes 165.

When the storage node insulation film 150 is formed using a PSG film and a PETEOS film, bridge defects have been caused by carbon residue remaining within the films in the dip-out process. This is because both of the PSG film and the PETEOS film are formed using the TEOS film and thus a significant amount of carbon is contained within the films. In order to prevent defects caused by carbon residue, the carbon residue is removed by applying high-concentration oxygen and high power during the deposition process using the TEOS source. However, the carbon residue is completely removed and bridge defects are still caused.

According to the embodiments of the present invention, bridge defects caused by carbon residue can be substantially prevented by using the HDP oxide films containing no carbon compound as the storage node insulation film 150 and subsequently performing the dip-out process. Thus, the reliability of the dip-out process can be improved. Furthermore, since the storage node insulation film 150 is formed in a single film structure of the HDP oxide film, it can be formed using a single deposition apparatus. Consequently, the process steps can be reduced and the process stability can be improved.

Moreover, the collapse or inclination of the cylindrical storage node electrodes can be substantially prevented by applying the NFC process which supports the storage node electrodes by coupling the upper portions of the adjacent cylinders with the nitride film The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for fabricating a storage node electrode in a semiconductor device, the method comprising:
    forming an etch stop film over an interlayer dielectric film in which a contact plug is formed;
    performing a primary high density plasma (HDP) process to form a first HDP oxide film over the etch stop film;
    performing a secondary HDP process to form a second HDP oxide film on the first HDP oxide film, an etching rate of the second HDP oxide film being slower than an etching rate of the first HDP oxide film;
    forming a support film over the second HDP oxide film;
    performing a tertiary HDP process to form a third HDP oxide film over the support film;
    forming a storage node contact hole exposing the contact plug by patterning the third HDP oxide film to the first HDP oxide film;
    forming a storage node electrode on an exposed surface of the storage node contact hole;
    partially removing the third HDP oxide film and the support film so that a support pattern supporting the storage node electrode is formed; and
    exposing an outer surface of the storage node electrode by removing the second HDP oxide film and the first HDP oxide film.

2. The method of claim 1, further comprising, before the first HDP process, performing a pre-heating to form a plasma oxide film by oxidizing a partial surface of the etch stop film.

3. The method of claim 1, wherein the primary pre-heating comprises supplying power for plasma generation while supplying a pre-heating gas including oxygen gas to the etch stop film, and forming a plasma oxide film by partially oxidizing a surface of the etch stop film.

4. The method of claim 1, wherein the primary HDP process comprises forming the first HDP oxide film by generating plasma while supplying an HDP deposition source to the semiconductor substrate.

5. The method of claim 4, wherein the HDP deposition source comprises oxygen ($O_2$) gas, silane ($SiH_4$) gas, and helium (He) gas.

6. The method of claim 1, wherein an etching rate of the second HDP oxide film is three to five times slower than an etching rate of the first HDP oxide film.

7. The method of claim 1, wherein the secondary HDP process is performed to generate plasma while additionally supplying hydrogen gas and argon gas to the first HDP oxide film together with the HDP deposition source.

8. The method of claim 7, wherein the secondary HDP process is performed while applying a bottom power for generation of the plasma is at a higher level than applying a bottom power for generation of the plasma when performing the primary HDP process.

9. The method of claim 1, further comprising, before the tertiary HDP process, performing a secondary pre-heating to form a plasma oxide film by partially oxidizing a surface of the support film.

10. The method of claim 9, wherein the secondary pre-heating comprises supplying power for plasma generation while supplying a pre-heating gas including oxygen gas to the etch stop film, and forming a plasma oxide film by partially oxidizing a surface of the etch stop film.

11. The method of claim 1, wherein the support film formed by using a low pressure deposition in a furnace comprises a nitride film and has a tensile stress of approximately 1E10 dyne/cm$^2$.

12. The method of claim 1, wherein the tertiary HDP process comprises generating plasma while additionally supplying hydrogen gas and argon gas to the support film together with an HDP deposition source, and forming a third HDP oxide film in which the third HDP oxide film has an etching rate substantially identical to an etching rate of the second HDP oxide film.

13. The method of claim 1, wherein the processes from the first HDP process to the third HDP process are performed in-situ at a process temperature of less than 320° C.

* * * * *